United States Patent
Tanioka et al.

(10) Patent No.: US 12,327,780 B2
(45) Date of Patent: Jun. 10, 2025

(54) SEMICONDUCTOR DEVICE INCLUDING A LEAD AND A SEALING RESIN

(71) Applicant: ROHM CO., LTD., Kyoto (JP)

(72) Inventors: Tomonori Tanioka, Kyoto (JP); Kazuo Egami, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 397 days.

(21) Appl. No.: 17/831,143

(22) Filed: Jun. 2, 2022

(65) Prior Publication Data
US 2022/0415764 A1 Dec. 29, 2022

(30) Foreign Application Priority Data
Jun. 29, 2021 (JP) .................... 2021-107705

(51) Int. Cl.
*H01L 23/495* (2006.01)
*H01L 23/00* (2006.01)
*H01L 23/31* (2006.01)

(52) U.S. Cl.
CPC .... *H01L 23/49541* (2013.01); *H01L 23/3107* (2013.01); *H01L 23/49513* (2013.01); *H01L 23/562* (2013.01); *H01L 24/29* (2013.01); *H01L 24/45* (2013.01); *H01L 2224/29111* (2013.01); *H01L 2224/45124* (2013.01); *H01L 2924/014* (2013.01)

(58) Field of Classification Search
CPC .................... H01L 24/29; H01L 24/45
USPC .......................................... 257/669
See application file for complete search history.

(56) References Cited

U.S. PATENT DOCUMENTS

| | | | | |
|---|---|---|---|---|
| 2014/0264383 A1* | 9/2014 | Kajiwara | ............ | H01L 23/3192 257/77 |
| 2015/0380342 A1* | 12/2015 | Kashiwazaki | .......... | H01L 24/32 438/123 |

FOREIGN PATENT DOCUMENTS

| | | |
|---|---|---|
| JP | 10-4170 A | 1/1998 |
| JP | 2017079229 A | 4/2017 |
| JP | 2017174951 A | 9/2017 |
| WO | 2020195847 A1 | 10/2020 |

OTHER PUBLICATIONS

Office Action issued in Japanese Application No. 2021-107705, dated Feb. 12, 2025, with English translation.

* cited by examiner

*Primary Examiner* — Caleb E Henry
*Assistant Examiner* — Dilinh P Nguyen
(74) *Attorney, Agent, or Firm* — HSML P. C.

(57) ABSTRACT

There is provided a technique that includes: a lead having a main surface facing in a thickness direction; a semiconductor element mounted over the main surface; and a sealing resin that is in contact with the main surface and covers the semiconductor element, wherein the lead is formed with a plurality of grooves that are recessed from the main surface and are located apart from each other, and wherein the plurality of grooves are located away from a peripheral edge of the main surface.

15 Claims, 17 Drawing Sheets

SEMICONDUCTOR DEVICE INCLUDING A LEAD AND A SEALING RESIN

CROSS-REFERENCE TO RELATED APPLICATION

This application is based upon and claims the benefit of priority from Japanese Patent Application No. 2021-107705, filed on Jun. 29, 2021, the entire contents of which are incorporated herein by reference.

TECHNICAL FIELD

The present disclosure relates to a semiconductor device including a lead and a sealing resin.

BACKGROUND

Patent Document 1 discloses an example of a semiconductor device including a first lead including a first pad having a pad main surface, a semiconductor element mounted on the pad main surface, and a sealing resin that is in contact with the pad main surface and covers the semiconductor element. The semiconductor element is conductively bonded to the first pad via a bonding layer. The semiconductor device further includes a second lead including a second pad and a wire (first bonding wire) conductively bonded to the semiconductor element and the second pad. The second pad and the wire are covered with the sealing resin. As a result, in the semiconductor device, the semiconductor element and members related to a conduction path of the semiconductor element are protected from external factors by the sealing resin.

When the semiconductor device disclosed in the related art is used, heat is generated from the semiconductor element. As a result, a thermal strain is generated in the first pad, so that a shear stress is generated at an interface between the pad main surface and the sealing resin. If the concentration of the shear stress becomes excessive, the sealing resin may peel off from the pad main surface and cracks may occur in the bonding layer interposed between the pad main surface and the semiconductor element. Further, due to the influence of heat conducted from the semiconductor element to the wire, a shear stress is also generated at a bonding interface between the second pad and the wire. This may cause pitting corrosion on the wire. Therefore, by improving the adhesion between the first pad/the second pad and the sealing resin, it is desired to prevent the sealing resin from peeling off and to prevent the bonding layer and the wire from being defective.

SUMMARY

Some embodiments of the present disclosure provide a semiconductor device capable of improving the adhesion between a lead and a sealing resin.

According to one embodiment of the present disclosure, there is provided a technique that includes: a lead having a main surface facing in a thickness direction; a semiconductor element mounted over the main surface; and a sealing resin that is in contact with the main surface and covers the semiconductor element, wherein the lead is formed with a plurality of grooves that are recessed from the main surface and are located apart from each other, and wherein the plurality of grooves are located away from a peripheral edge of the main surface.

Other features and advantages of the present disclosure will become more apparent with the detailed description given below based on the accompanying drawings.

DETAILED DESCRIPTION

Figure 1:
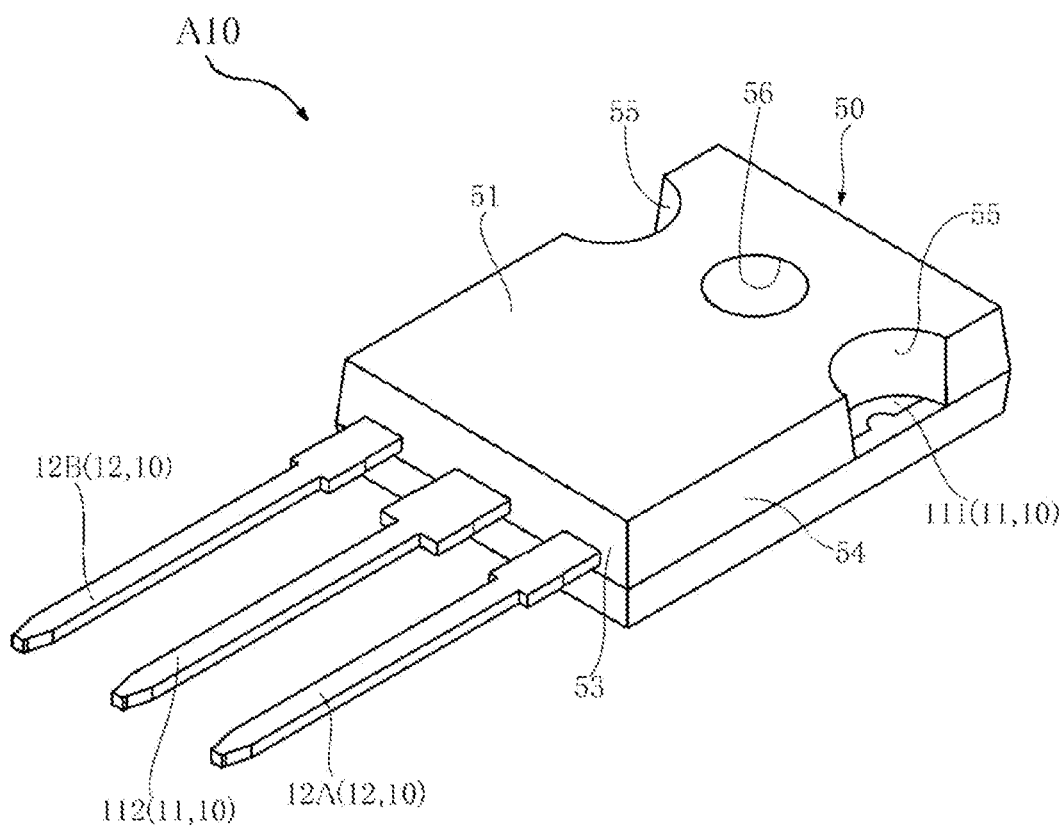
FIG. 1 is a perspective view of a semiconductor device according to a first embodiment of the present disclosure.

Embodiments for carrying out the present disclosure will now be described with reference to the accompanying drawings.

First Embodiment

A semiconductor device A10 according to a first embodiment of the present disclosure will be described with reference to FIGS. 1 to 12. The semiconductor device A10 is used for an electronic apparatus or the like including a power conversion circuit such as a DC-DC converter. The semiconductor device A10 includes a lead 10, a semiconductor element 30, a first bonding layer 39, a plurality of conductive members 40, and a sealing resin 50. Here, FIGS. 3, 8, and 11 are transparent to the sealing resin 50 for the sake of convenience of understanding. In FIG. 3, the sealing resin 50 is indicated by an imaginary line (two-dot chain line).

In the description of the semiconductor device A10, for the sake of convenience, a thickness direction of the lead 10 is referred to as a "thickness direction z." A direction orthogonal to the thickness direction z is referred to as a "first direction x." A direction orthogonal to both the thickness direction z and the first direction x is referred to as a "second direction y." When viewed along the thickness direction z, the first direction x corresponds to a longitudinal direction (or long side direction) of the semiconductor device A10. When viewed along the thickness direction z, the second direction y corresponds to a lateral direction (or short side direction) of the semiconductor device A10.

Figure 6:
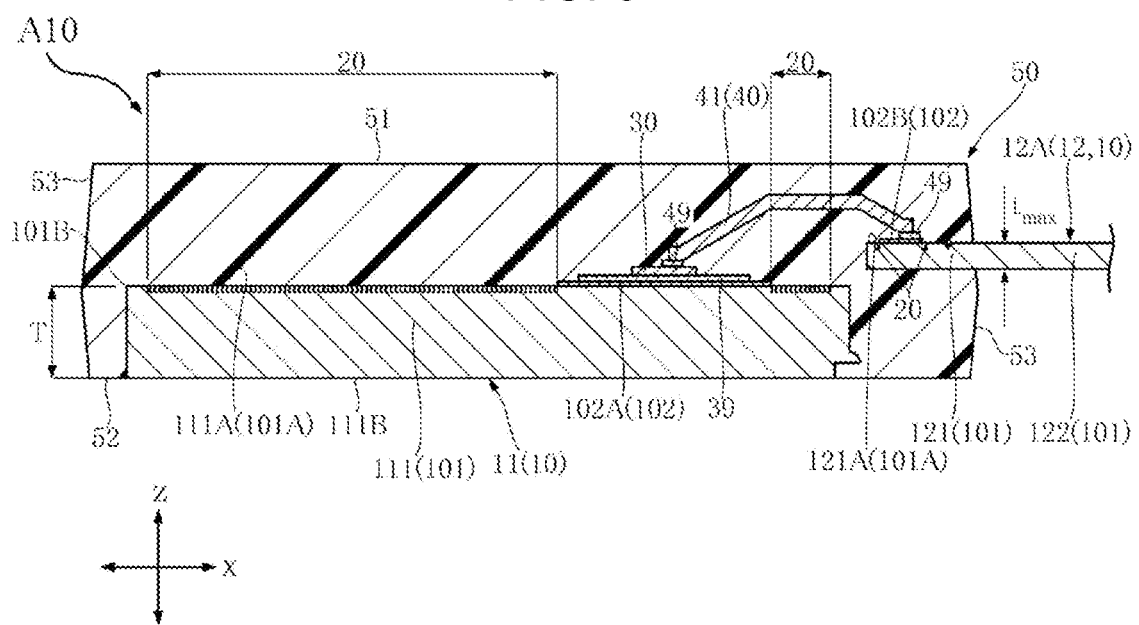
FIG. 6 is a cross-sectional view taken along line VI-VI of FIG. 3.
Figure 7:
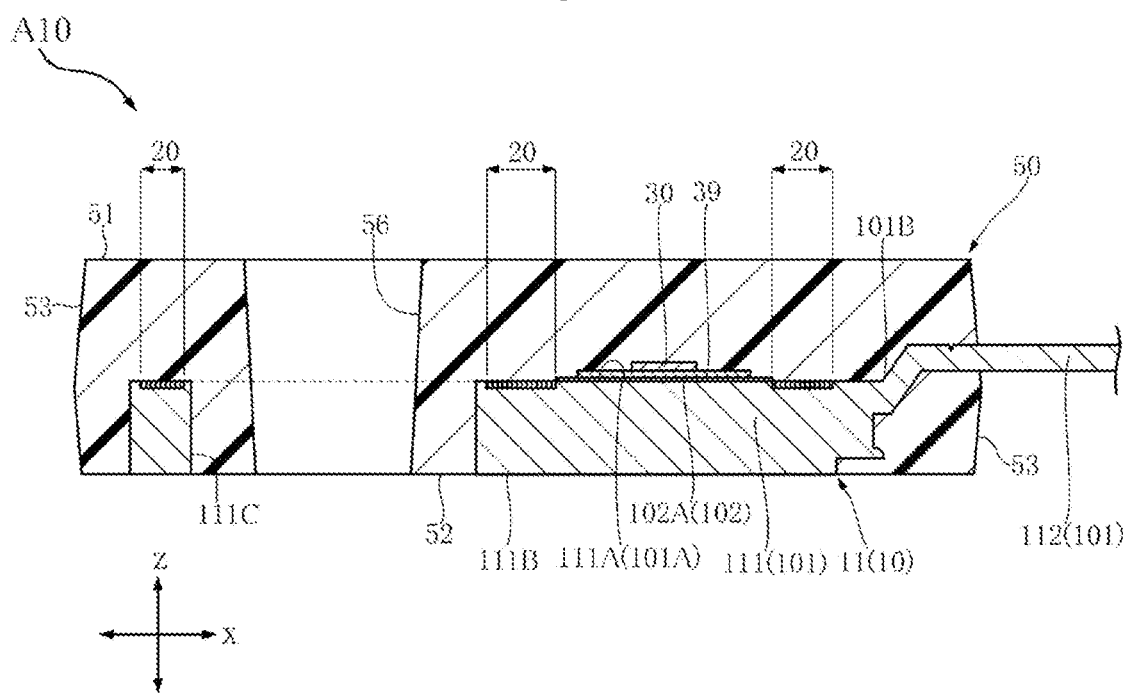
FIG. 7 is a cross-sectional view taken along line VII-VII of FIG. 3.
Figure 8:
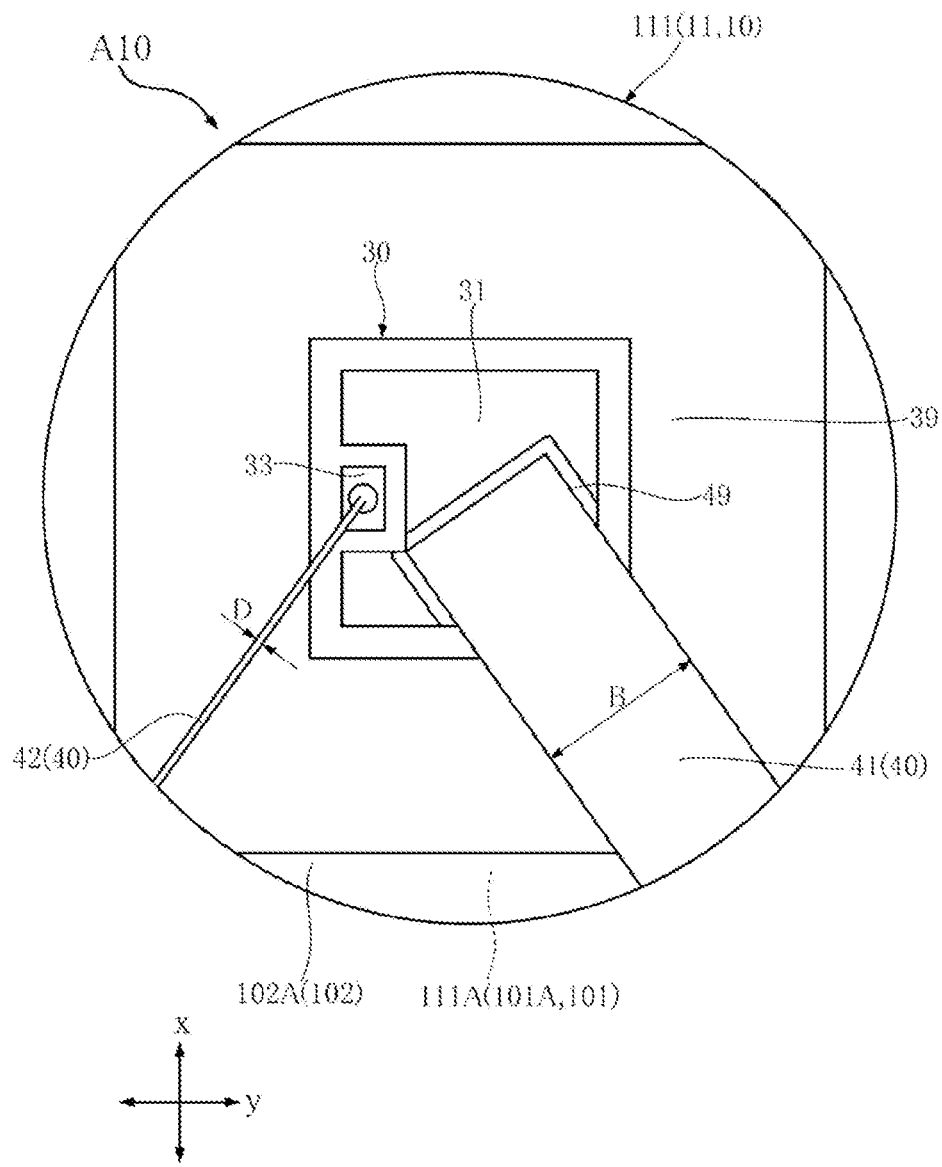
FIG. 8 is a partially enlarged view of a semiconductor element shown in FIG. 3 and its vicinity thereof.

As shown in FIGS. 3, 6, and 7, the lead 10 is a conductive member on which the semiconductor element 30 is mounted and which forms a portion of a conduction path between the semiconductor element 30 and a wiring board on which the semiconductor device A10 is mounted. In the semiconductor device A10, the lead 10 includes a die pad 11 and a plurality of terminals 12, which are located apart from each other.

As shown in FIGS. 6 and 7, the die pad 11 and the plurality of terminals 12 include a base material 101 and a metal layer 102. The base material 101 forms a main part of the lead 10 and is obtained from the same lead frame. The lead frame is copper (Cu) or a copper alloy. Therefore, the composition of the base material 101 contains copper. The base material 101 has a main surface 101A facing one side of the thickness direction z. The metal layer 102 is laminated on the main surface 101A. A thickness of the metal layer 102 is thinner than a thickness of the base material 101. The composition of the metal layer 102 includes silver (Ag). In addition, the composition of the metal layer 102 may include nickel (Ni).

As shown in FIGS. 3 and 7, the die pad 11 has a pad portion 111 and a terminal portion 112. The pad portion 111 includes the base material 101 and a first metal layer 102A. The base material 101 of the pad portion 111 has a first main surface 111A, a back surface 111B, and a through-hole 111C. The first main surface 111A is included in the main surface 101A. The back surface 111B faces a side opposite to the first main surface 111A in the thickness direction z. The back surface 111B is plated with, for example, tin (Sn). The through-hole 111C extends from the first main surface 111A to the back surface 111B in the thickness direction z and penetrates the pad portion 111. The through-hole 111C has a circular shape when viewed along the thickness direction z. The first metal layer 102A is laminated on the first main surface 111A. The first metal layer 102A is included in the metal layer 102. As shown in FIG. 6, a thickness T of the base material 101 of the pad portion 111 is thicker than the maximum thickness $t_{max}$ of each base material 101 of the plurality of terminals 12.

As shown in FIGS. 3 and 7, the terminal portion 112 includes a portion extending along the first direction x and is connected to the base material 101 of the pad portion 111. Therefore, the pad portion 111 and the terminal portion 112 are electrically connected to each other. A portion of the terminal portion 112 is covered with the sealing resin 50. The portion of the terminal portion 112 covered with the sealing resin 50 is bent when viewed along the second direction y. A surface of the terminal portion 112 exposed from the sealing resin 50 is plated with tin.

As shown in FIGS. 3, 6, and 7, the semiconductor element 30 is mounted over the first main surface 111A of the pad portion 111 of the die pad 11. In the semiconductor device A10, the semiconductor element 30 is an n-channel type MOSFET (Metal-Oxide-Semiconductor-Field-Effect-Transistor) having a vertical structure. The semiconductor element 30 includes a compound semiconductor substrate. A main material of the compound semiconductor substrate is silicon carbide (SiC). In addition, silicon (Si) may be used as the main material of the compound semiconductor substrate. In the semiconductor device A10, an area of the semiconductor element 30 is 40% or less of an area of the first main surface 111A when viewed along the thickness direction z. The semiconductor element 30 is not limited to the MOSFET. The semiconductor element 30 may be another transistor such as an IGBT (Insulated Gate Bipolar Transistor). Further, the semiconductor element 30 may be an LSI or a diode. The semiconductor element 30 includes a first electrode 31, a second electrode 32, and a third electrode 33.

Figure 9:
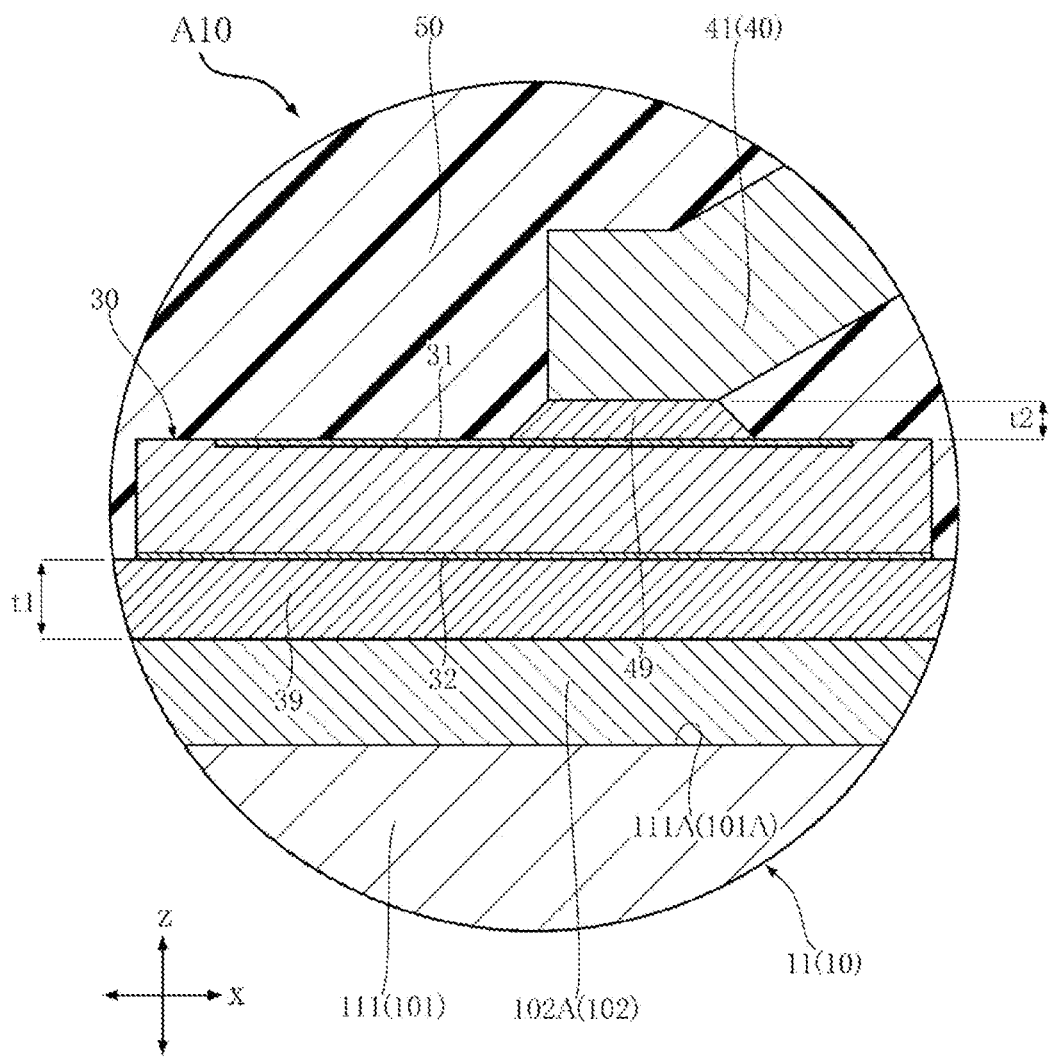
FIG. 9 is a partially enlarged view of a semiconductor device shown in FIG. 6 and its vicinity thereof.

As shown in FIGS. 8 and 9, the first electrode 31 is provided on a side facing the first main surface 111A of the pad portion 111 of the die pad 11 in the thickness direction z. A current corresponding to power after being converted by the semiconductor element 30 flows through the first electrode 31. That is, the first electrode 31 corresponds to a source of the semiconductor element 30.

As shown in FIG. 9, the second electrode 32 is provided on a side opposite to the first electrode 31 in the thickness direction z. The second electrode 32 faces the first main surface 111A of the pad portion 111 of the die pad 11. A current corresponding to power before being converted by the semiconductor element 30 flows through the second electrode 32. That is, the second electrode 32 corresponds to a drain of the semiconductor element 30.

As shown in FIG. 8, the third electrode 33 is provided on the same side as the first electrode 31 in the thickness direction z and is located away from the first electrode 31. A gate voltage for driving the semiconductor element 30 is applied to the third electrode 33. That is, the third electrode 33 corresponds to the gate of the semiconductor element 30. An area of the third electrode 33 is smaller than an area of the first electrode 31 when viewed along the thickness direction z.

As shown in FIG. 9, the first bonding layer 39 is interposed between the first main surface 111A of the pad portion 111 of the die pad 11 and the second electrode 32 of the semiconductor element 30. The first bonding layer 39 is in contact with the first metal layer 102A of the pad portion 111, and the second electrode 32. The first bonding layer 39 is located on the first metal layer 102A. The first bonding layer 39 contains a metal element. The metal element is, for example, tin. The first bonding layer 39 is, for example, solder. The second electrode 32 is conductively bonded to the pad portion 111 via the first bonding layer 39. Therefore, the terminal portion 112 of the die pad 11 corresponds to a drain terminal of the semiconductor device A10.

As shown in FIG. 3, the plurality of terminals 12 are electrically connected to the semiconductor element 30. The plurality of terminals 12 have a cover portion 121 and an exposed portion 122. The cover portion 121 is covered with the sealing resin 50. The cover portion 121 includes the base material 101 and a second metal layer 102B. The base material 101 of the cover portion 121 has a second main surface 121A. The second main surface 121A is included in the main surface 101A. The second metal layer 102B is laminated on the second main surface 121A. The second metal layer 102B is included in the metal layer 102. When viewed along the thickness direction z, an area of the second metal layer 102B is smaller than an area of the first metal layer 102A of the pad portion 111 of the die pad 11. The exposed portion 122 is connected to the base material 101 of the cover portion 121 and is exposed from the sealing resin 50. The exposed portion 122 extends from the cover portion 121 to the side away from the pad portion 111 of the die pad 11 in the first direction x. The surface of the exposed portion 122 is plated with, for example, tin.

As shown in FIG. 3, in the semiconductor device A10, the plurality of terminals 12 include a first terminal 12A and a second terminal 12B. The first terminal 12A extends along the first direction x and is located next to the terminal portion 112 of the die pad 11 in the second direction y. The first terminal 12A is electrically connected to the first electrode 31 of the semiconductor element 30. Therefore, the first terminal 12A corresponds to a source terminal of the semiconductor device A10.

As shown in FIG. 3, the second terminal 12B extends along the first direction x and is located on an opposite side of the first terminal 12A with the terminal portion 112 of the die pad 11 sandwiched therebetween in the second direction y. The second terminal 12B is electrically connected to the third electrode 33 of the semiconductor element 30. Therefore, the second terminal 12B corresponds to a gate terminal of the semiconductor device A10.

Figure 5:
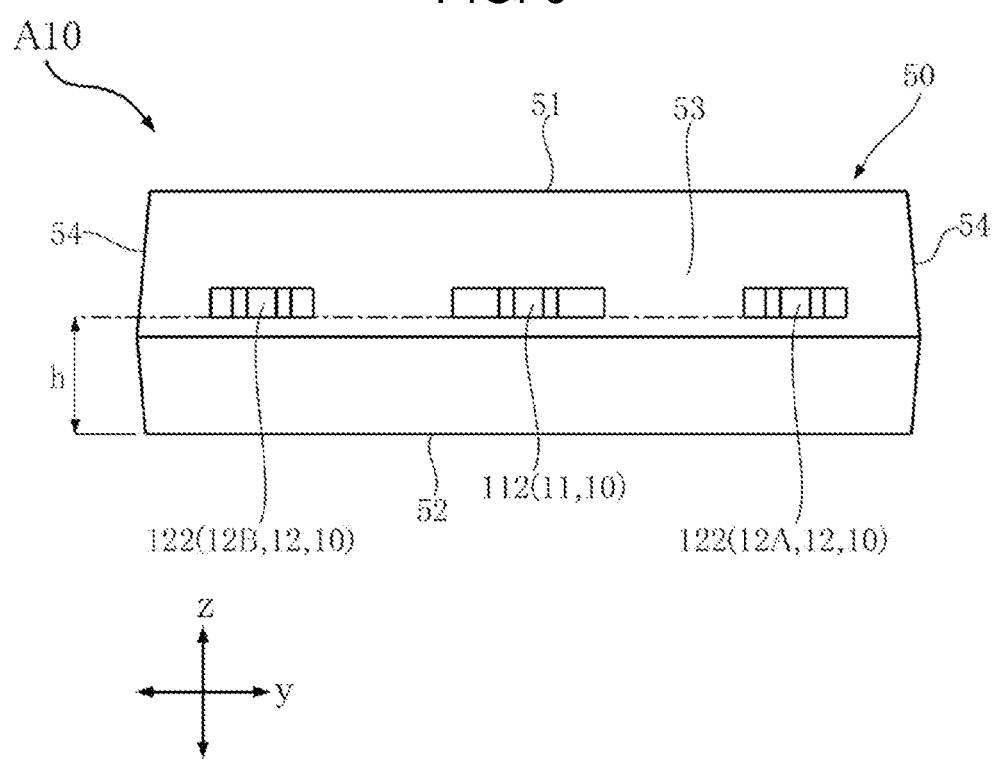
FIG. 5 is a front view of the semiconductor device shown in FIG. 1.

As shown in FIG. 5, in the semiconductor device A10, the portion of the terminal portion 112 of the die pad 11 exposed from the sealing resin 50, the exposed portion 122 of the first terminal 12A, and the exposed portion 122 of the second terminal 12B have a same height h. When viewed along the second direction y, a portion of the terminal portion 112 overlaps the exposed portion 122 of the first terminal 12A and the exposed portion 122 of the second terminal 12B.

Figure 11:
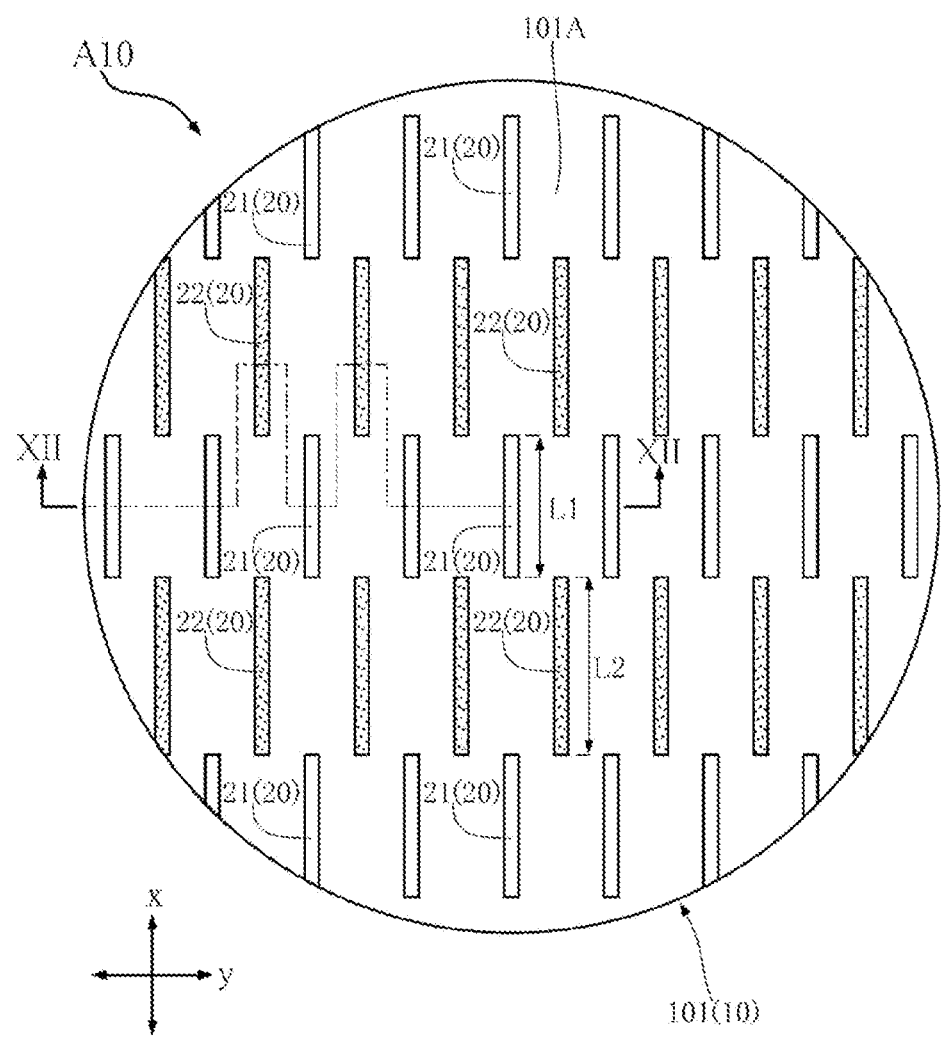
FIG. 11 is a partially enlarged view of a lead shown in FIG. 3.
Figure 12:
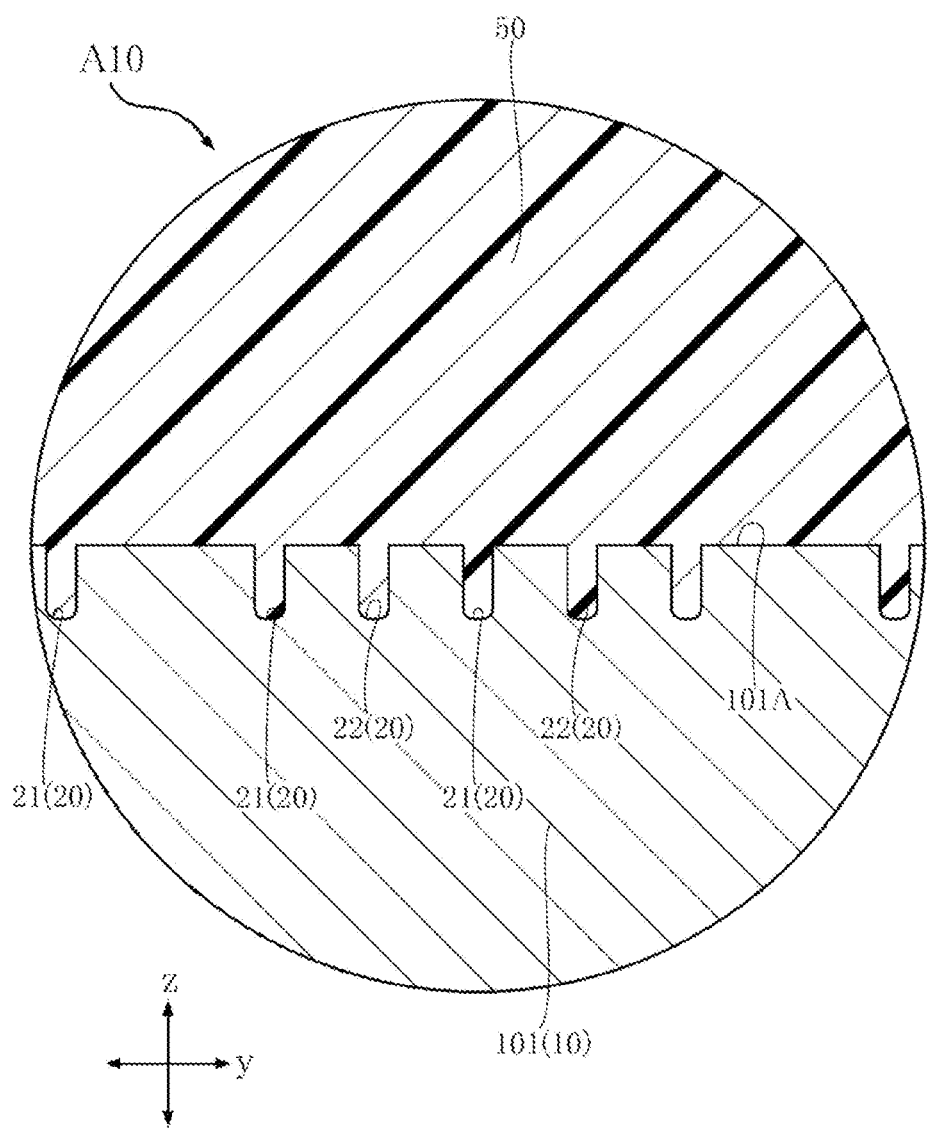
FIG. 12 is a cross-sectional view taken along line XII-XII of FIG. 11.

As shown in FIGS. 3, 11, and 12, a plurality of grooves 20 are formed in the lead 10 (the die pad 11 and the plurality of terminals 12). The plurality of grooves 20 are recessed from the main surface 101A (the first main surface 111A and the second main surface 121A) of the base material 101 and are located apart from each other. As shown in FIGS. 3, 6, and 7, the plurality of grooves 20 are located apart from a peripheral edge 101B of the main surface 101A. The plurality of grooves 20 are formed by subjecting the main surface 101A to laser machining. In FIG. 3, a portion of the lead 10 in which the plurality of grooves 20 are formed is indicated by a region of a plurality of straight lines.

As shown in FIG. 11, the plurality of grooves 20 include a plurality of first grooves 21 and a plurality of second grooves 22. The plurality of first grooves 21 and the plurality of second grooves 22 are arranged along the first direction x. The plurality of first grooves 21 and the plurality of second grooves 22 have a linear shape extending in a direction orthogonal to the thickness direction z. As a result, the plurality of first grooves 21 and the plurality of second grooves 22 form a broken line when viewed along the thickness direction z. In FIG. 11, the plurality of second grooves 22 are indicated by a region of a plurality of points.

As shown in FIG. 11, in the semiconductor device A10, the plurality of first grooves 21 and the plurality of second grooves 22 extend in the first direction x. The plurality of second grooves 22 are located next to the plurality of first grooves 21 in the second direction y. In the first direction x, at least a portion of any one of the plurality of second grooves 22 is located between two adjacent first grooves 21 in the first direction x among the plurality of first grooves 21. A length L2 of each of the plurality of second grooves 22 is longer than a length L1 of each of the plurality of first grooves 21.

As shown in FIG. 3, in the pad portion 111 of the die pad 11 of the lead 10, the plurality of grooves 20 surround the first bonding layer 39 and the first metal layer 102A when viewed along the thickness direction z. Further, in the cover portion 121 of the plurality of terminals 12 of the lead 10, the plurality of grooves 20 surround the second metal layer 102B when viewed along the thickness direction z.

As shown in FIG. 3, the plurality of conductive members 40 are conductively bonded to the semiconductor element 30 and the plurality of terminals 12. As a result, mutual conduction between the semiconductor element 30 and the plurality of terminals 12 is achieved. The plurality of conductive members 40 include a first member 41 and a second member 42.

Figure 10:
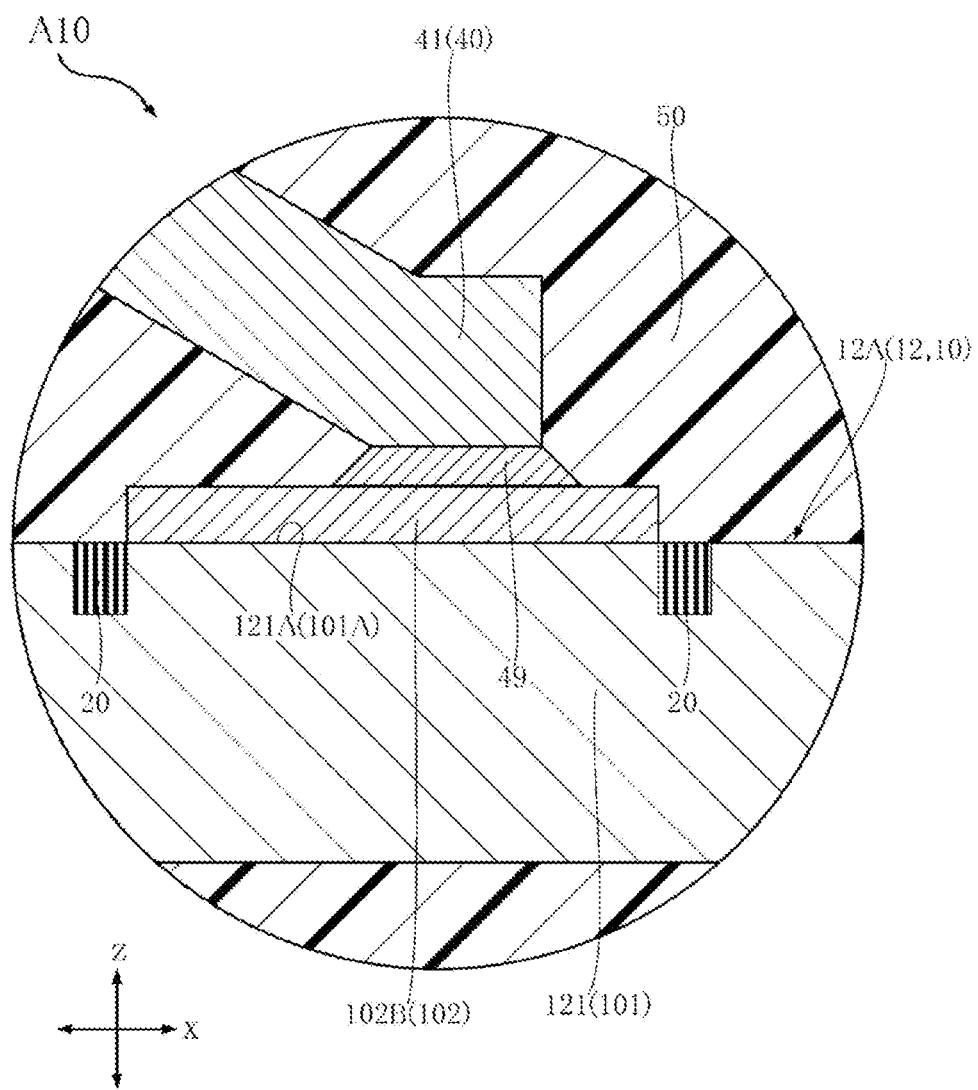
FIG. 10 is a partially enlarged view of a cover portion of a terminal (first terminal) shown in FIG. 6 and its vicinity thereof.

As shown in FIGS. 3, 9, and 10, the first member 41 is conductively bonded to the first electrode 31 of the semiconductor element 30 and the second metal layer 102B of the cover portion 121 of the first terminal 12A. As a result, the first terminal 12A is electrically connected to the first electrode 31. The composition of the first member 41 includes copper. In the semiconductor device A10, the first member 41 is a metal clip. The first member 41 is conductively bonded to the first electrode 31 and the second metal layer 102B via a second bonding layer 49. The second bonding layer 49 contains a metal element. The metal element is, for example, tin. The second bonding layer 49 is, for example, solder. As shown in FIG. 9, a thickness t2 of the second bonding layer 49 is smaller than a thickness t1 of the first bonding layer 39. In addition, the first member 41 may be a wire. In this case, since the first member 41 is formed by wire bonding, the second bonding layer 49 becomes unnecessary.

As shown in FIGS. 3 and 8, the second member 42 is conductively bonded to the third electrode 33 of the semiconductor element 30 and the second metal layer 102B of the cover portion 121 of the second terminal 12B. As a result, the second terminal 12B is electrically connected to the third electrode 33. The second member 42 is a wire. The second member 42 is formed by wire bonding. The composition of the second member 42 includes aluminum (Al).

The differences between the first member 41 and the second member 42 will be described below. The Young's modulus (elastic modulus) of the second member 42 is smaller than the Young's modulus of the first member 41. This is based on the fact that, as described above, the composition of the first member 41 includes copper and the composition of the second member 42 includes aluminum. Therefore, a linear expansion coefficient of the second member 42 is larger than a linear expansion coefficient of the first member 41. In addition, a thermal conductivity of the second member 42 is smaller than a thermal conductivity of the first member 41. Further, as shown in FIG. 8, a width B of the first member 41 is larger than a width (diameter) D of the second member 42.

As shown in FIGS. 6 and 7, the sealing resin 50 covers the semiconductor element 30, the plurality of conductive members 40, and a portion of each of the die pad 11 and the plurality of terminals 12. The sealing resin 50 is in contact with the main surface 101A of the base material 101 of the lead 10. The sealing resin 50 has electrical insulation. The sealing resin 50 is made of a material including, for example, a black epoxy resin. The sealing resin 50 has a top surface 51, a bottom surface 52, a pair of first side surfaces 53, a pair of second side surfaces 54, a pair of openings 55, and a mounting hole 56.

As shown in FIGS. 6 and 7, the top surface 51 faces the same side as the first main surface 111A of the pad portion 111 of the die pad 11 in the thickness direction z. As shown in FIGS. 5 to 7, the bottom surface 52 faces a side opposite to the top surface 51 in the thickness direction z. The back surface 111B of the pad portion 111 is exposed from the bottom surface 52.

Figure 2:
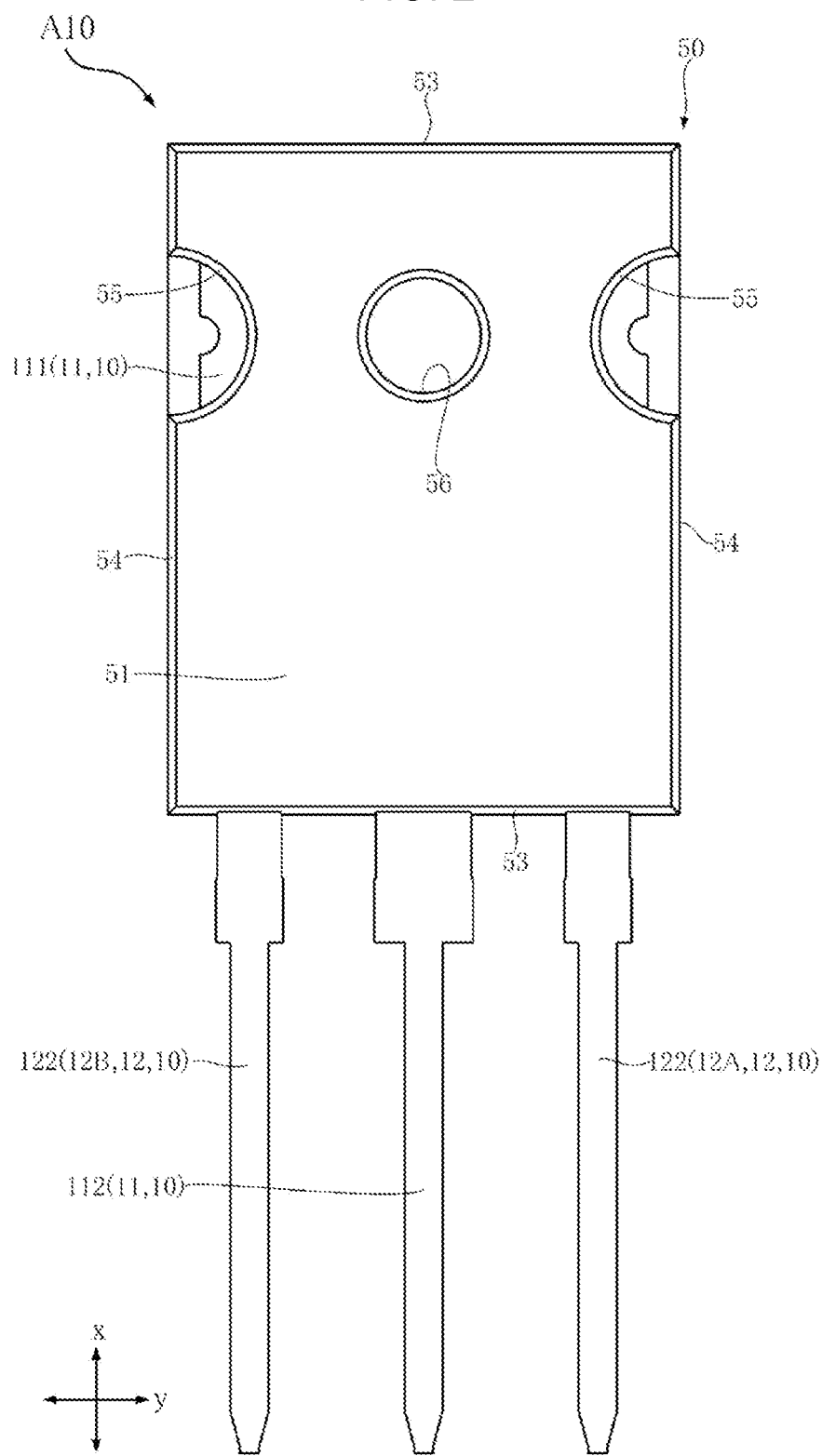
FIG. 2 is a plan view of the semiconductor device shown in FIG. 1.
Figure 3:
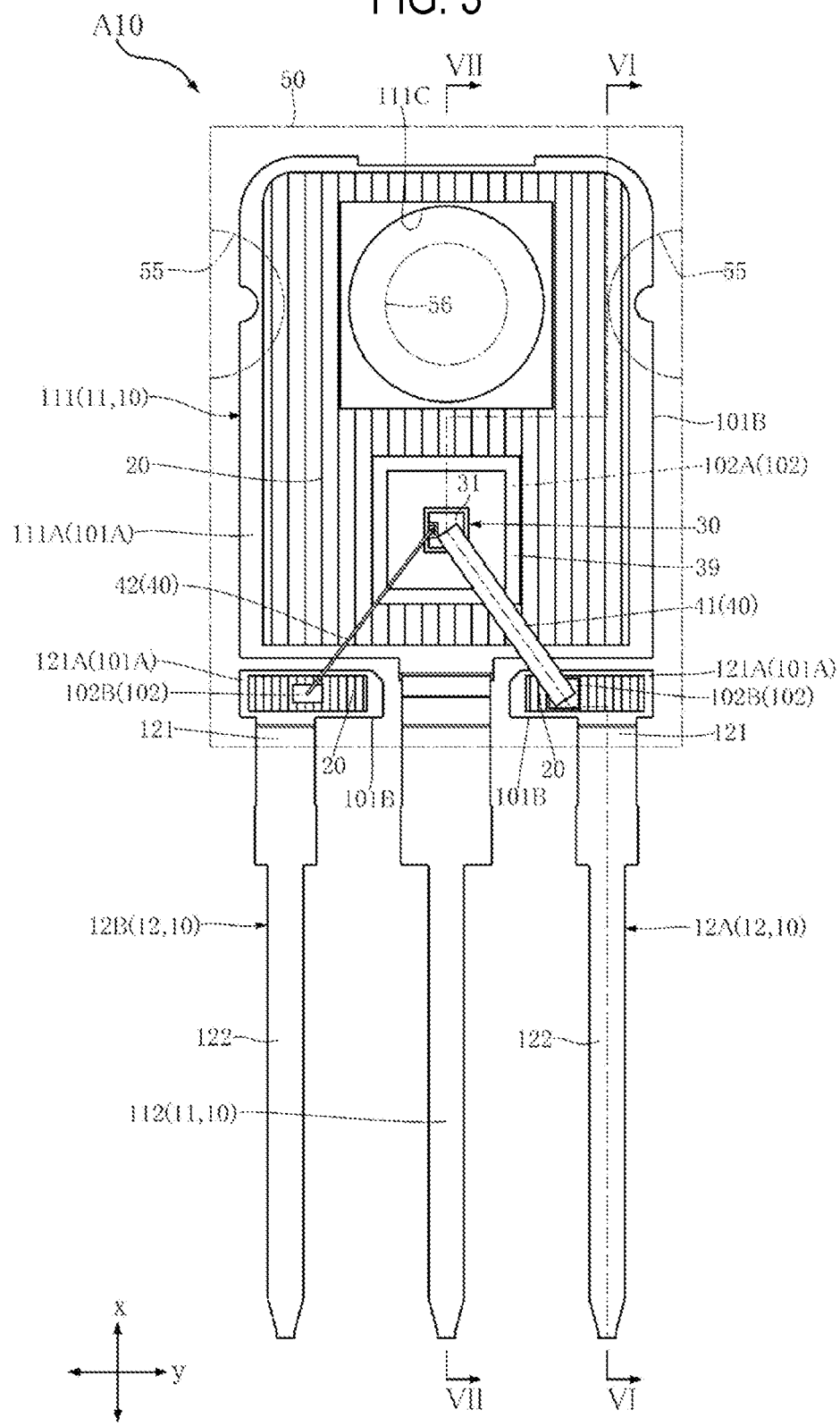
FIG. 3 is a plan view corresponding to FIG. 2, which is transparent to a sealing resin.
Figure 4:
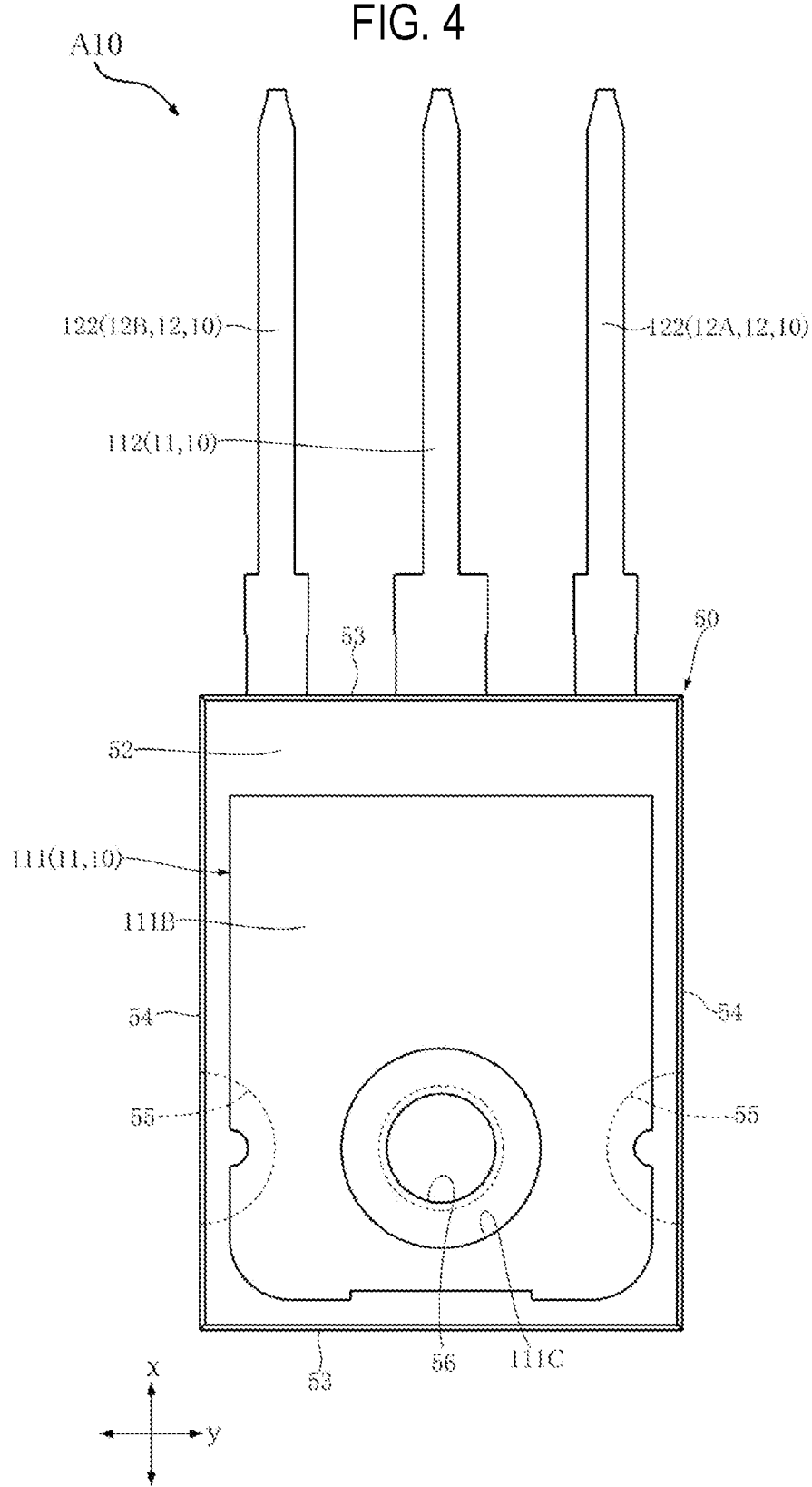
FIG. 4 is a bottom view of the semiconductor device shown in FIG. 1.

As shown in FIGS. 2 and 4, the pair of first side surfaces 53 are located apart from each other in the first direction x. The pair of first side surfaces 53 are connected to the top surface 51 and the bottom surface 52. As shown in FIG. 5, a portion of the terminal portion 112 of the die pad 11 and the exposed portion 122 of the first terminal 12A and the second terminal 12B are exposed from one of the pair of first side surfaces 53.

As shown in FIGS. 2, 4, and 5, the pair of second side surfaces 54 are located apart from each other in the second direction y. The pair of second side surfaces 54 are connected to the top surface 51 and the bottom surface 52. As shown in FIG. 2, the pair of openings 55 are located apart from each other in the second direction y. Each of the pair of openings 55 is recessed toward inward side of the sealing resin 50 from the top surface 51 and any one of the pair of second side surfaces 54. The first main surface 111A of the pad portion 111 of the die pad 11 is exposed from the pair of openings 55. As shown in FIGS. 2, 4, and 7, the mounting hole 56 extends from the top surface 51 to the bottom surface 52 in the thickness direction z and penetrates the sealing resin 50. When viewed along the thickness direction z, the mounting hole 56 is included in the through-hole 111C of the pad portion 111 of the die pad 11. An inner peripheral surface of the pad portion 111 that defines the through-hole 111C is covered with the sealing resin 50. As a result, the maximum dimension of the mounting hole 56 is smaller than the dimension of the through-hole 111C when viewed along the thickness direction z.

Modification of the First Embodiment

Figure 13:
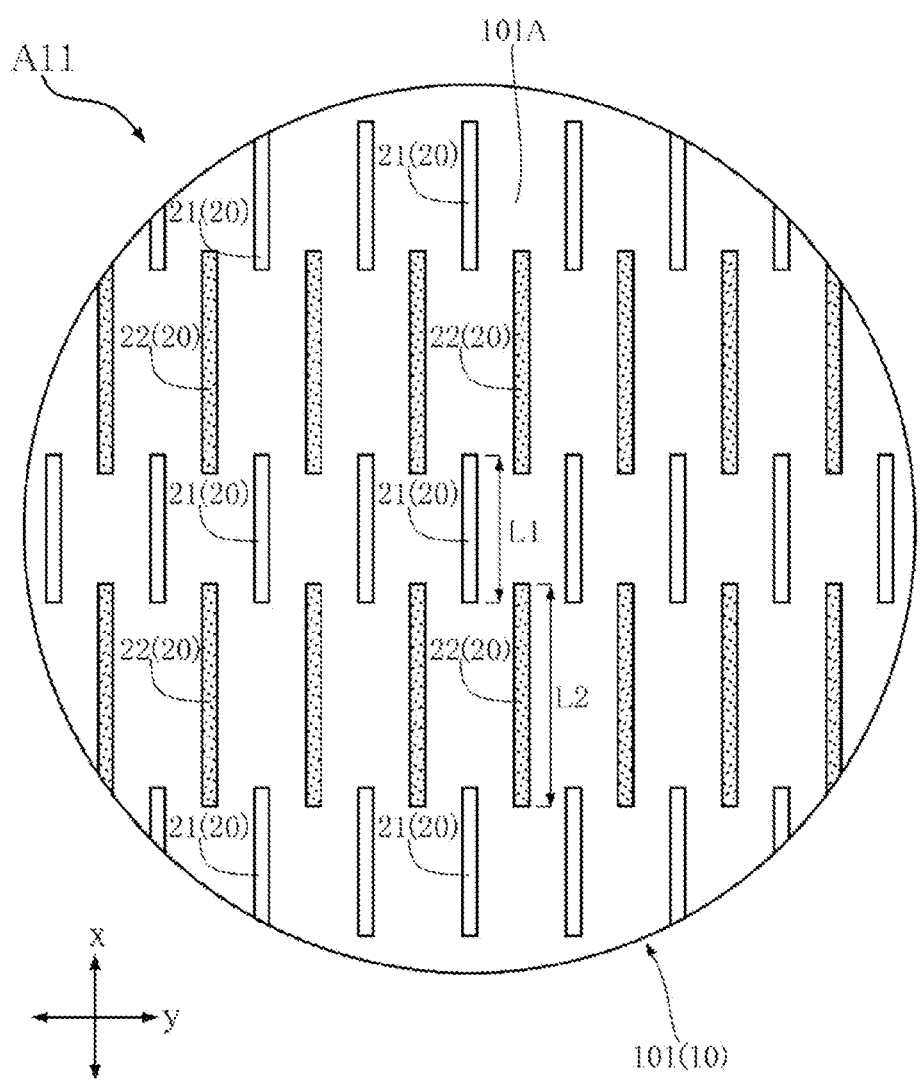
FIG. 13 is a partially enlarged plan view of a modification of the semiconductor device shown in FIG. 1, which is transparent to the sealing resin.

Next, a semiconductor device A11, which is a modification of the semiconductor device A10, will be described with reference to FIG. 13. Here, the position of FIG. 13 is the same as the position of FIG. 11. Similar to FIG. 11, FIG. 13 is transparent to the sealing resin 50, and the plurality of second grooves 22 are indicated by a region of a plurality of points.

The semiconductor device A11 is different from the semiconductor device A10 in the configuration of the plurality of second grooves 22 among the plurality of grooves 20. As shown in FIG. 13, when viewed along the second direction y, both sides of any of the plurality of second grooves 22 in the first direction x overlap with two adjacent first grooves 21 in the first direction x among the plurality of first grooves 21. This configuration is obtained by setting a length L2 of each of the plurality of second grooves 22 to be longer than a length L2 in the case of the semiconductor device A10.

Next, the operation and effects of the semiconductor device A10 will be described.

The semiconductor device A10 includes the lead 10 having the main surface 101A, the semiconductor element 30 mounted over the main surface 101A, and the sealing resin 50 that is in contact with the main surface 101A and covers the semiconductor element 30. The lead 10 is formed with the plurality of grooves 20 that are recessed from the main surface 101A and are located apart from each other. The plurality of grooves 20 are located apart from a peripheral edge 101B of the main surface 101A. As a result, when the sealing resin 50 in contact with the main surface 101A is inserted into the plurality of grooves 20, the sealing resin 50 exhibits an anchoring effect. As a result, a bonding strength of the sealing resin 50 with respect to the main surface 101A increases. Therefore, according to the semiconductor device A10, it is possible to improve the adhesion between the lead 10 and the sealing resin 50.

The plurality of grooves 20 include the plurality of first grooves 21 and the plurality of second grooves 22 arranged along the first direction x. The plurality of first grooves 21 and the plurality of second grooves 22 have a linear shape extending in a direction orthogonal to the thickness direction z. As a result, since the plurality of first grooves 21 and the plurality of second grooves 22 form a broken line, the extension of the plurality of grooves 20 per unit area of the main surface 101A of the lead 10 can be shortened. Therefore, according to the semiconductor device A10, it is possible to shorten the laser machining time for forming the plurality of grooves 20 while improving the adhesion between the lead 10 and the sealing resin 50.

In the semiconductor device A10, the plurality of second grooves 22 are located next to the plurality of first grooves 21 in the second direction y. The plurality of first grooves 21 and the plurality of second grooves 22 extend in the first direction x. In the first direction x, at least a portion of any of the plurality of second grooves 22 is located between two adjacent first grooves 21 among the plurality of first grooves 21. As a result, the plurality of grooves 20 can resist a shear stress, which is delivered to the interface between the main surface 101A of the lead 10 and the sealing resin 50, from multiple directions. Therefore, it is possible to further increase a bonding strength of the sealing resin 50 with respect to the main surface 101A while shortening the laser machining time for forming the plurality of grooves 20.

In the semiconductor device A11, when viewed along the second direction y, both sides of one of the plurality of second grooves 22 in the first direction x overlap with two adjacent first grooves 21 among the plurality of first grooves 21. As a result, the plurality of grooves 20 can more strongly resist the shear stress delivered in the second direction y to the interface between the main surface 101A of the lead 10 and the sealing resin 50.

The semiconductor device A10 further includes the conductive member 40 (the first member 41) conductively bonded to the first electrode 31 of the semiconductor element 30 and the terminal 12 (the first terminal 12A) which is one element of the lead 10. The terminal 12 includes the base material 101 having the second main surface 121A, and the metal layer 102 (the second metal layer 102B) laminated on the second main surface 121A. The second main surface 121A is included in the main surface 101A where the plurality of grooves 20 are to be formed. The conductive member 40 is conductively bonded to the metal layer 102. When the adhesion between the base material 101 of the terminal 12 and the sealing resin 50 is improved with the formation of the plurality of grooves 20, the shear stress delivered to the bonding interface between the metal layer 102 and the conductive member 40 can be reduced. Therefore, it is possible to prevent the occurrence of pitting corrosion of the conductive member 40. Further, when the conductive member 40 is conductively bonded to the metal layer 102 in the manufacture of the semiconductor device A10, the metal layer 102 has an effect of reducing an impact caused by the conduction bonding, which is delivered to the base material 101.

The semiconductor device A10 further includes a bonding layer (the first bonding layer 39) interposed between the first main surface 111A of the die pad 11 (the pad portion 111) and the semiconductor element 30. The die pad 11 is an element of the lead 10. The first main surface 111A is included in the main surface 101A where the plurality of grooves 20 are to be formed. When the adhesion between the die pad 11 and the sealing resin 50 is improved with the formation of the plurality of grooves 20, the shear stress delivered to the interface between the first main surface 111A and the sealing resin 50 is less likely to reach the bonding layer. This makes it possible to prevent the occurrence of cracks in the bonding layer.

In the above case, it is preferable that the plurality of grooves 20 surround the bonding layer when viewed along the thickness direction z. As a result, the shear stress reaching the bonding layer from the interface between the first main surface 111A of the die pad 11 and the sealing resin 50 can be effectively reduced. Further, in the manufacture of the semiconductor device A10, when the semiconductor element 30 is bonded to the die pad 11, the bonding layer melted by reflow (when the bonding layer is solder) can be prevented by the plurality of grooves 20 from being excessively wetted and spreading on the first main surface 111A. This makes it possible to prevent short-circuit between the die pad 11 and the terminal 12 due to the bonding layer adhered to the terminal 12. Further, it is possible to suppress a positional deviation of the semiconductor element 30 with respect to the first main surface 111A due to the molten bonding layer.

When viewed along the thickness direction z, the plurality of grooves 20 surround the first metal layer 102A laminated on the first main surface 111A of the die pad 11. The bonding layer is located on the first metal layer 102A. As a result, in the manufacture of the semiconductor device A10, when the semiconductor element 30 is bonded to the die pad 11, it is possible to prevent the bonding layer from being wetted and spreading on the first main surface 111A while improving the wettability of the bonding layer (when the bonding layer is solder) with respect to the die pad 11.

The thickness t1 of the first bonding layer 39 is larger than the thickness t2 of the second bonding layer 49. As a result, when the semiconductor device A10 is used, heat generated from the semiconductor element 30 is likely to be conducted to the die pad 11 having a larger volume than each of the plurality of conductive members 40. This makes it possible to improve heat dissipation of the semiconductor device A10.

The composition of the base material 101 of the lead 10 includes copper. Further, the thickness T of the base material 101 of the pad portion 111 of the die pad 11 is larger than the maximum thickness $t_{max}$ of the terminal 12. As a result, it is possible to increase efficiency of heat conduction in the direction orthogonal to the thickness direction z while improving heat conductivity of the pad portion 111. This contributes to the improvement of heat dissipation of the die pad 11.

The base material 101 of the pad portion 111 has the back surface 111B facing a side opposite to the first main surface 111A in the thickness direction z. The back surface 111B is exposed from the bottom surface 52 of the sealing resin 50. As a result, while the sealing resin 50 protects the semiconductor element 30 and the conductive member 40 from external factors, it is possible to avoid a decrease in heat dissipation of the semiconductor device A10.

Second Embodiment

Figure 14:
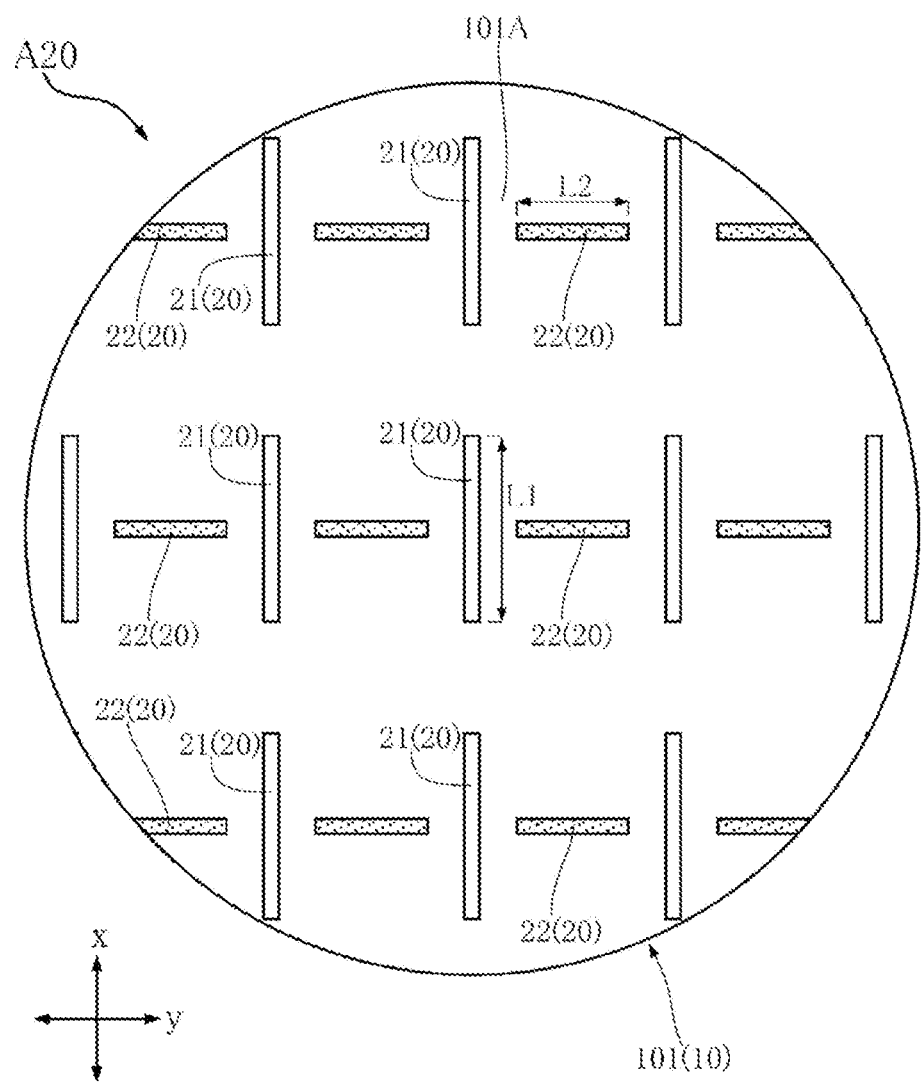
FIG. 14 is a partially enlarged plan view of a semiconductor device according to a second embodiment of the present disclosure, which is transparent to a sealing resin.

A semiconductor device A20 according to a second embodiment of the present disclosure will be described with reference to FIG. 14. In this figure, the same or similar elements of the above-described semiconductor device A10 are denoted by the same reference numerals, and explanation thereof will not be repeated. Here, the position of FIG. 14 is the same as the position of FIG. 11 showing the semiconductor device A10. Similar to FIG. 11, FIG. 14 is transparent to the sealing resin 50, and the plurality of second grooves 22 are indicated by a region of a plurality of points.

The semiconductor device A20 is different from the above-described semiconductor device A10 in the configuration of the plurality of grooves 20.

As shown in FIG. 14, the plurality of first grooves 21 extend in the first direction x. The plurality of second grooves 22 extend in the second direction y. When viewed along the second direction y, any of the plurality of second grooves 22 overlaps with any of the plurality of first grooves 21. A length L2 of each of the plurality of second grooves 22 is shorter than a length L1 of each of the plurality of first grooves 21.

Modification of the Second Embodiment

Figure 15:
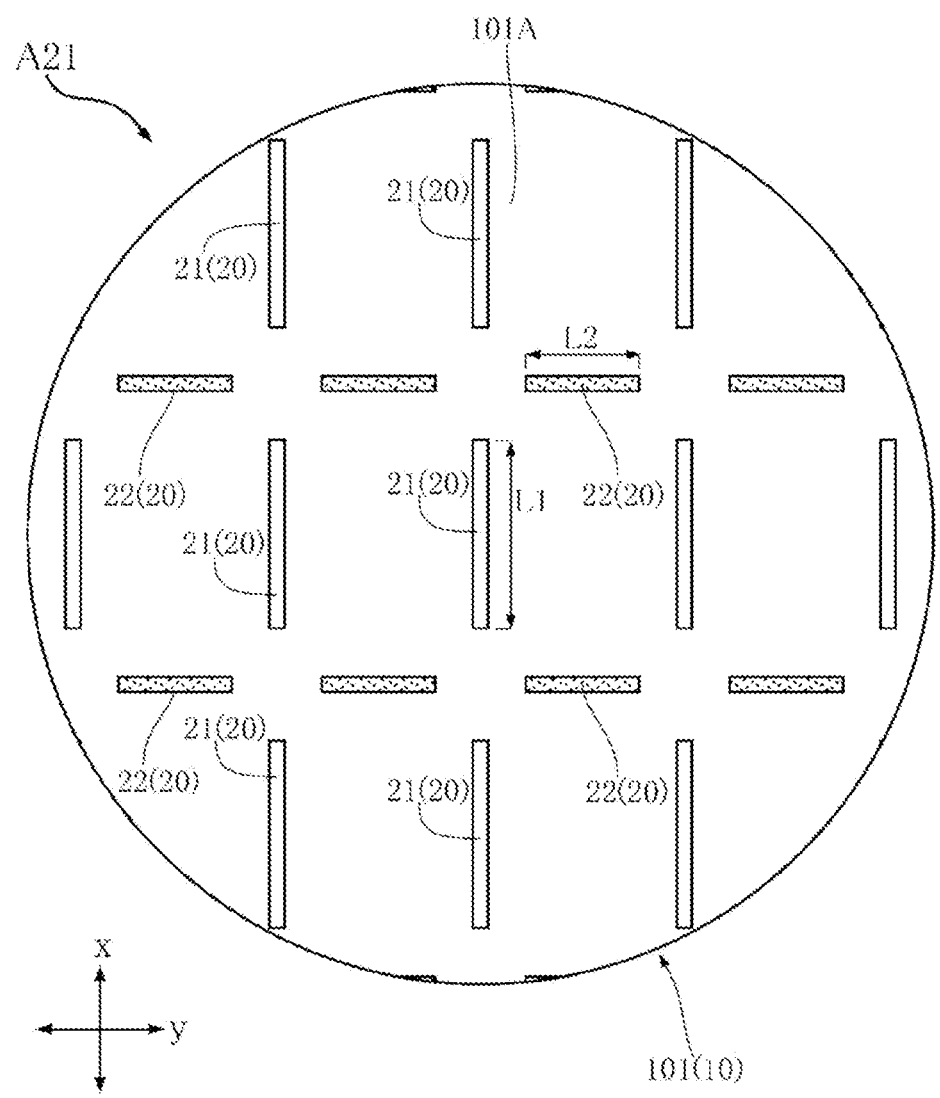
FIG. 15 is a partially enlarged plan view of a modification of the semiconductor device shown in FIG. 14, which is transparent to the sealing resin.

Next, a semiconductor device A21, which is a modification of the semiconductor device A20, will be described with reference to FIG. 15. Here, the position of FIG. 15 is the same as the position of FIG. 14. Similar to FIG. 14, FIG. 15 is transparent to the sealing resin 50, and the plurality of second grooves 22 are indicated by a region of a plurality of points.

The semiconductor device A21 is different from the semiconductor device A20 in the configuration of the plurality of second grooves 22 among the plurality of grooves 20. As shown in FIG. 15, in the first direction x, any of the plurality of second grooves 22 is located between two adjacent first grooves 21 in the first direction x among the plurality of first grooves 21.

Next, the operation and effects of the semiconductor device A20 will be described.

The semiconductor device A20 includes the lead 10 having the main surface 101A, the semiconductor element 30 mounted over the main surface 101A, and the sealing resin 50 that is in contact with the main surface 101A and covers the semiconductor element 30. The lead 10 is formed with the plurality of grooves 20 that are recessed from the main surface 101A and are located apart from each other. The plurality of grooves 20 are located apart from the peripheral edge 101B of the main surface 101A. Therefore, the semiconductor device A20 can also improve the adhesion between the lead 10 and the sealing resin 50.

Also in the semiconductor device A20, the plurality of grooves 20 include the plurality of first grooves 21 and the plurality of second grooves 22 arranged along the first direction x. The plurality of first grooves 21 and the plurality of second grooves 22 have a linear shape extending in a direction orthogonal to the thickness direction z. Therefore, the semiconductor device A20 also makes it possible to shorten the laser machining time for forming the plurality of grooves 20 while improving the adhesion between the lead 10 and the sealing resin 50.

In the semiconductor device A20, the plurality of second grooves 22 are located next to the plurality of first grooves 21 in the second direction y. The plurality of first grooves 21 extend in the first direction x. The plurality of second grooves 22 extend in the second direction y. As a result, the plurality of grooves 20 can resist the shear stress, which is delivered to the interface between the main surface 101A of the lead 10 and the sealing resin 50, from multiple directions. Further, the extension of the plurality of grooves 20 per unit area of the main surface 101A can be shortened as compared with the case of the semiconductor device A10. Therefore, according to the semiconductor device A20, it is possible to further increase a bonding strength of the sealing resin 50 with respect to the main surface 101A while further shortening a laser machining time for forming the plurality of grooves 20.

In the semiconductor device A21, in the first direction x, any one of the plurality of second grooves 22 is located between two adjacent first grooves 21 among the plurality of first grooves 21. As a result, a distance between the two adjacent first grooves 21 in the first direction x among the plurality of first grooves 21 can be set longer. Therefore, the extension of the plurality of grooves 20 per unit area of the main surface 101A of the lead 10 can be further shortened as compared with the case of the semiconductor device A20.

In the semiconductor device A20, a length L2 of each of the plurality of second grooves 22 is shorter than a length L1 of each of the plurality of first grooves 21. With this configuration, it is possible to prevent the distance between the two adjacent first grooves 21 in the second direction y among the plurality of first grooves 21 from being excessively widened. As a result, it is possible to ensure an increase of a bonding strength of the lead 10 with respect to the main surface 101A.

Further, when the semiconductor device A20 has the same configuration as the semiconductor device A10, the semiconductor device A20 also exerts the operation and effects related to the configuration.

Third Embodiment

Figure 16:
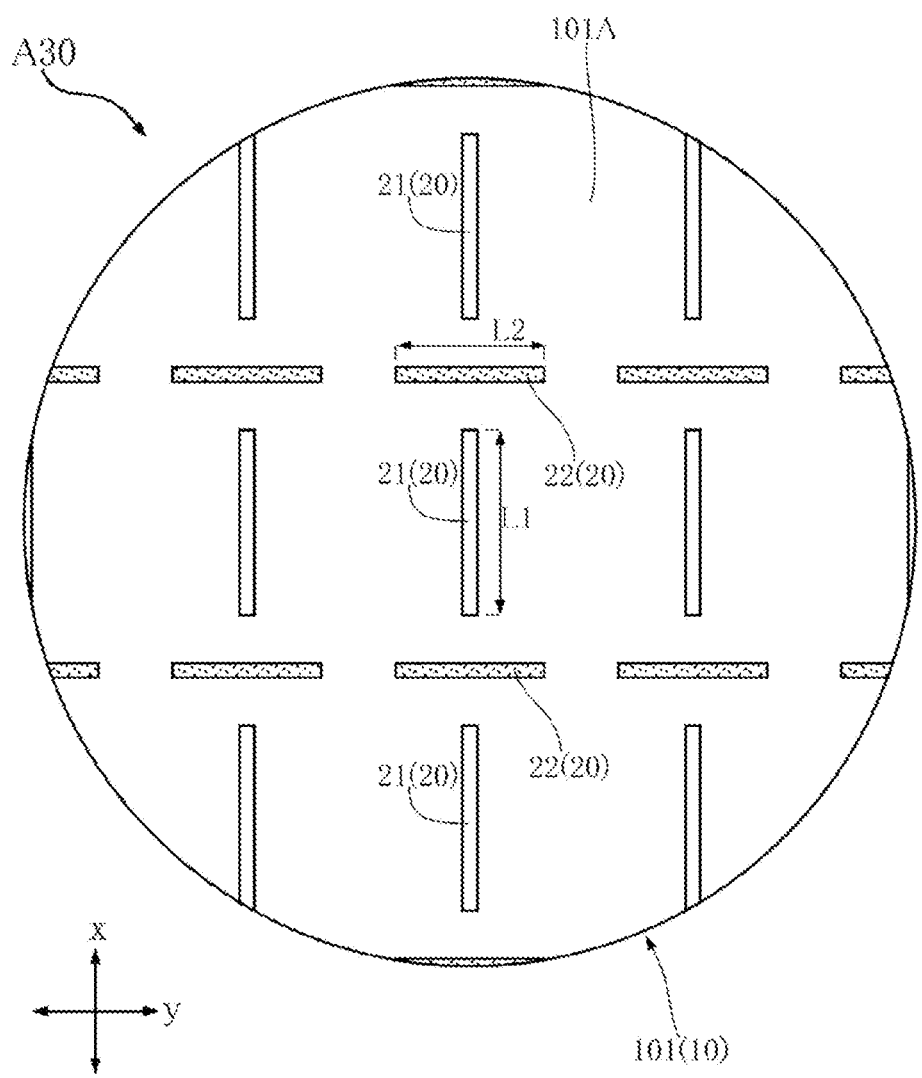
FIG. 16 is a partially enlarged plan view of a semiconductor device according to a third embodiment of the present disclosure, which is transparent to a sealing resin.

A semiconductor device A30 according to a third embodiment of the present disclosure will be described with reference to FIG. 16. In this figure, the same or similar elements of the above-described semiconductor device A10 are denoted by the same reference numerals, and explanation thereof will not be repeated. Here, the position of FIG. 16 is the same as the position of FIG. 11 showing the semiconductor device A10. Similar to FIG. 11, FIG. 16 is transparent to the sealing resin 50, and the plurality of second grooves 22 are indicated by a region of a plurality of points.

The semiconductor device A30 is different from the above-described semiconductor device A10 in the configuration of the plurality of grooves 20.

As shown in FIG. 16, the plurality of first grooves 21 extend in the first direction x. The plurality of second grooves 22 extend in the second direction y. One of the plurality of second grooves 22 is located between two adjacent first grooves 21 among the plurality of first grooves 21.

Modification of the Third Embodiment

Figure 17:
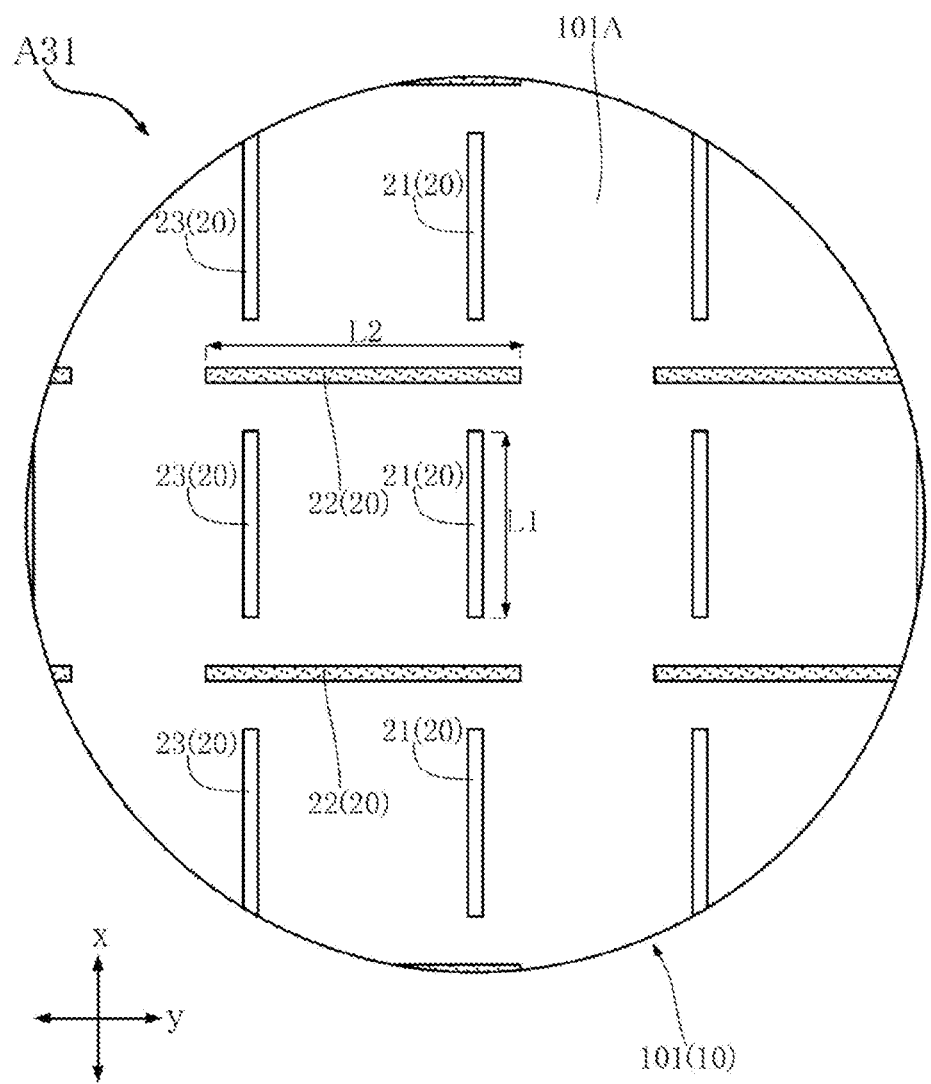
FIG. 17 is a partially enlarged plan view of a modification of the semiconductor device shown in FIG. 16, which is transparent to the sealing resin.

Next, a semiconductor device A31, which is a modification of the semiconductor device A30, will be described with reference to FIG. 17. Here, the position of FIG. 17 is the same as the position of FIG. 16. Similar to FIG. 16, FIG. 17 is transparent to the sealing resin 50, and the plurality of second grooves 22 are indicated by a region of a plurality of points.

The semiconductor device A31 is different from the semiconductor device A30 in the configuration of the plurality of grooves 20. As shown in FIG. 17, the plurality of grooves 20 include a plurality of third grooves 23. The plurality of third grooves 23 are arranged along the first direction x and are located next to the plurality of first grooves 21 in the second direction y. The plurality of third grooves 23 extend in the first direction x. One of the plurality of second grooves 22 is located between two adjacent third grooves 23 in the first direction x among the plurality of third grooves 23. That is, both sides of any of the plurality of second grooves 22 in the second direction y are sandwiched between two first grooves 21 adjacent to each other in the first direction x and two adjacent third grooves 23 in the first direction x.

Next, the operation and effects of the semiconductor device A30 will be described.

The semiconductor device A30 includes the lead 10 having the main surface 101A, the semiconductor element 30 mounted over the main surface 101A, and the sealing resin 50 that is in contact with the main surface 101A and covers the semiconductor element 30. The lead 10 is formed with the plurality of grooves 20 that are recessed from the main surface 101A and are located apart from each other. The plurality of grooves 20 are located apart from the peripheral edge 101B of the main surface 101A. Therefore, the semiconductor device A30 can also improve the adhesion between the lead 10 and the sealing resin 50.

Also in the semiconductor device A30, the plurality of grooves 20 include the plurality of first grooves 21 and the plurality of second grooves 22 arranged along the first direction x. The plurality of first grooves 21 and the plurality of second grooves 22 have a linear shape extending in a direction orthogonal to the thickness direction z. Therefore, the semiconductor device A30 can also shorten the laser machining time for forming the plurality of grooves 20 while improving the adhesion between the lead 10 and the sealing resin 50.

In the semiconductor device A30, the plurality of first grooves 21 extend in the first direction x. The plurality of second grooves 22 extend in the second direction y. One of the plurality of second grooves 22 is located between two adjacent first grooves 21 among the plurality of first grooves 21. As a result, the plurality of grooves 20 can resist the shear stress, which is delivered to the interface between the main surface 101A of the lead 10 and the sealing resin 50, from multiple directions. Further, the extension of the plurality of grooves 20 per unit area of the main surface 101A can be shortened as compared with the case of the semiconductor device A10. Therefore, according to the semiconductor device A30, it is possible to further increase a bonding strength of the sealing resin 50 with respect to the main surface 101A while further shortening the laser machining time for forming the plurality of grooves 20.

In the semiconductor device A31, the plurality of grooves 20 include the plurality of third grooves 23 arranged along the first direction x and located next to the plurality of first grooves 21 in the second direction y. The plurality of third grooves 23 extend in the first direction x. One of the plurality of second grooves 22 is located between two adjacent third grooves 23 among the plurality of third grooves 23. As a result, the plurality of grooves 20 can more strongly resist the shear stress in the first direction x, which is delivered to the interface between the main surface 101A of the lead 10 and the sealing resin 50.

Further, when the semiconductor device A30 has the same configuration as the semiconductor device A10, the semiconductor device A30 also exerts the operation and effects related to the configuration.

The present disclosure is not limited to the above-described embodiments. The specific configuration of each part of the present disclosure can be freely changed in design.

The technical configurations of the semiconductor device provided by the present disclosure and the method for manufacturing the semiconductor device are described below.

[Supplementary Note 1]

A semiconductor device including:
a lead having a main surface facing in a thickness direction;
a semiconductor element mounted over the main surface; and
a sealing resin that is in contact with the main surface and covers the semiconductor element,
wherein the lead is formed with a plurality of grooves that are recessed from the main surface and are located apart from each other, and
wherein the plurality of grooves are located away from a peripheral edge of the main surface.

[Supplementary Note 2]

The semiconductor device of Supplementary Note 1, wherein the plurality of grooves include a plurality of first grooves and a plurality of second grooves arranged along a first direction which is a direction orthogonal to the thickness direction, and
wherein the plurality of first grooves and the plurality of second grooves are linear shapes extending in a direction orthogonal to the thickness direction.

[Supplementary Note 3]

The semiconductor device of Supplementary Note 2, wherein the plurality of second grooves are located next to the plurality of first grooves in a second direction orthogonal to the thickness direction and the first direction.

[Supplementary Note 4]

The semiconductor device of Supplementary Note 3, wherein the plurality of first grooves and the plurality of second grooves extend in the first direction, and
wherein, in the first direction, at least a portion of any of the plurality of second grooves is located between two adjacent first grooves among the plurality of first grooves.

[Supplementary Note 5]

The semiconductor device of Supplementary Note 4, wherein, when viewed along the second direction, both sides of any of the plurality of second grooves in the first direction overlap with the two adjacent first grooves among the plurality of first grooves.

[Supplementary Note 6]

The semiconductor device of Supplementary Note 4 or 5, wherein a length of each of the plurality of second grooves is longer than a length of each of the plurality of first grooves.

[Supplementary Note 7]

The semiconductor device of Supplementary Note 3, wherein the plurality of first grooves extend in the first direction, and
wherein the plurality of second grooves extend in the second direction.

[Supplementary Note 8]

The semiconductor device of Supplementary Note 7, wherein, in the first direction, any of the plurality of second grooves is located between two adjacent first grooves among the plurality of first grooves.

[Supplementary Note 9]

The semiconductor device of Supplementary Note 7 or 8, wherein a length of each of the plurality of second grooves is shorter than a length of each of the plurality of first grooves.

[Supplementary Note 10]

The semiconductor device of Supplementary Note 2, wherein the plurality of first grooves extend in the first direction,
wherein the plurality of second grooves extend in a second direction orthogonal to the thickness direction and the first direction, and
wherein any of the plurality of second grooves is located between two adjacent first grooves among the plurality of first grooves.

[Supplementary Note 11]

The semiconductor device of Supplementary Note 10, wherein the plurality of grooves further include a plurality of third grooves arranged along the first direction and located next to the plurality of first grooves in the second direction,
wherein the plurality of third grooves extend in the first direction, and
wherein any of the plurality of second grooves is located between two adjacent third grooves among the plurality of third grooves.

[Supplementary Note 12]

The semiconductor device of any one of Supplementary Notes 1 to 11, wherein the lead includes a die pad and a terminal located apart from each other,
wherein the main surface includes a first main surface included in the die pad and a second main surface included in the terminal,
wherein the semiconductor element is mounted over the first main surface, and
wherein the terminal is electrically connected to the semiconductor element.

[Supplementary Note 13]

The semiconductor device of Supplementary Note 12, wherein the semiconductor element includes a first electrode provided on a side facing the first main surface in the thickness direction, and
wherein the semiconductor device further includes a conductive member conductively bonded to the first electrode and the terminal.

[Supplementary Note 14]

The semiconductor device of Supplementary Note 13, wherein the terminal includes a base material having the second main surface, and a metal layer laminated on the second main surface, and
wherein the conductive member is conductively bonded to the metal layer.

[Supplementary Note 15]

The semiconductor device of Supplementary Note 13 or 14, further including a bonding layer interposed between the first main surface and the semiconductor element,
wherein the bonding layer contains a metal element.

[Supplementary Note 16]

The semiconductor device of Supplementary Note 15, wherein the semiconductor element includes a second electrode provided on a side opposite to the first electrode in the thickness direction, and
wherein the second electrode is conductively bonded to the die pad via the bonding layer.

[Supplementary Note 17]

The semiconductor device of Supplementary Note 15 or 16, wherein the plurality of grooves surround the bonding layer when viewed along the thickness direction.

According to the present disclosure in some embodiments, it is possible to provide a semiconductor device capable of improving adhesion between a lead and a sealing resin.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor device comprising:
   a lead having a main surface facing in a thickness direction;
   a semiconductor element mounted over the main surface; and
   a sealing resin that is in contact with the main surface and covers the semiconductor element,
     wherein the lead is formed with a plurality of grooves that are recessed from the main surface and are located apart from each other,
     wherein the plurality of grooves are located away from a peripheral edge of the main surface,
     wherein the plurality of grooves include a plurality of first grooves and a plurality of second grooves arranged along a first direction which is a direction orthogonal to the thickness direction,
     wherein the plurality of first grooves and the plurality of second grooves are linear shapes extending orthogonally to the thickness direction,
     wherein the plurality of second grooves are located next to the plurality of first grooves in a second direction orthogonal to the thickness direction and the first direction, and
     wherein along the first direction, at least two of the plurality of first grooves and at least two of the plurality of second grooves are alternately arranged.

2. The semiconductor device of claim 1,
   wherein the plurality of first grooves and the plurality of second grooves extend in the first direction, and
   wherein, in the first direction, at least a portion of any of the plurality of second grooves is located between two adjacent first grooves among the plurality of first grooves.

3. The semiconductor device of claim 2, wherein, when viewed along the second direction, both sides of any of the plurality of second grooves in the first direction overlap with two adjacent first grooves among the plurality of first grooves.

4. The semiconductor device of claim 2, wherein a length of each of the plurality of second grooves is longer than a length of each of the plurality of first grooves.

5. The semiconductor device of claim 1,
   wherein the plurality of first grooves extend in the first direction, and
   wherein the plurality of second grooves extend in the second direction.

6. The semiconductor device of claim 5, wherein, along the first direction, any of the plurality of second grooves is located between two adjacent first grooves among the plurality of first grooves.

7. The semiconductor device of claim 5, wherein a length of each of the plurality of second grooves is shorter than a length of each of the plurality of first grooves.

8. The semiconductor device of claim 1,
   wherein the plurality of first grooves extend in the first direction,
   wherein the plurality of second grooves extend in the second direction, and
   wherein any of the plurality of second grooves is located between two adjacent first grooves among the plurality of first grooves.

9. The semiconductor device of claim 8,
   wherein the plurality of grooves further include a plurality of third grooves arranged along the first direction and located next to the plurality of first grooves in the second direction,
   wherein the plurality of third grooves extend in the first direction, and
   wherein any of the plurality of second grooves is located between two adjacent third grooves among the plurality of third grooves.

10. The semiconductor device of claim 1,
    wherein the lead includes a die pad and a terminal located apart from each other,
    wherein the main surface includes a first main surface included in the die pad and a second main surface included in the terminal,
    wherein the semiconductor element is mounted over the first main surface, and wherein the terminal is electrically connected to the semiconductor element.

11. The semiconductor device of claim 10,
    wherein the semiconductor element includes a first electrode provided on a side facing the first main surface in the thickness direction, and
    wherein the semiconductor device further comprises a conductive member conductively bonded to the first electrode and the terminal.

12. The semiconductor device of claim 11,
    wherein the terminal includes a base material having the second main surface, and a metal layer laminated on the second main surface, and
    wherein the conductive member is conductively bonded to the metal layer.

13. The semiconductor device of claim 11, further comprising:
    a bonding layer interposed between the first main surface and the semiconductor element, wherein the bonding layer contains a metal element.

14. The semiconductor device of claim 13,
    wherein the semiconductor element includes a second electrode provided on a side opposite to the first electrode in the thickness direction, and
    wherein the second electrode is conductively bonded to the die pad via the bonding layer.

15. The semiconductor device of claim 13, wherein the plurality of grooves surround the bonding layer when viewed along the thickness direction.

* * * * *